(12) United States Patent
Nagasawa et al.

(10) Patent No.: US 9,788,449 B2
(45) Date of Patent: Oct. 10, 2017

(54) POWER CONVERSION APPARATUS

(71) Applicant: Keihin Corporation, Tokyo (JP)

(72) Inventors: Kazuya Nagasawa, Tochigi (JP);
Hiroaki Iida, Tochigi (JP); Morifumi Shigemasa, Tochigi (JP); Yasuhiro Maeda, Tochigi (JP); Masami Ogura, Tochigi (JP); Hitoshi Nishio, Wako (JP)

(73) Assignee: KEIHIN CORPORATION, Tokyo (JP)

( * ) Notice: Subject to any disclaimer, the term of this patent is extended or adjusted under 35 U.S.C. 154(b) by 0 days.

(21) Appl. No.: 14/844,157

(22) Filed: Sep. 3, 2015

(65) Prior Publication Data
US 2016/0081233 A1   Mar. 17, 2016

(30) Foreign Application Priority Data

Sep. 11, 2014   (JP) ................................. 2014-185134

(51) Int. Cl.
*H05K 7/20* (2006.01)
*H05K 7/14* (2006.01)

(52) U.S. Cl.
CPC .................. *H05K 7/1432* (2013.01)

(58) Field of Classification Search
CPC .................................... H05K 7/20927
USPC ........................................................ 361/752
See application file for complete search history.

(56) References Cited

U.S. PATENT DOCUMENTS

| 8,363,420 B2 * | 1/2013 | Tominaga ................ H05K 3/32 |
| | | 361/715 |
| 8,996,807 B2 | 3/2015 | Joshi et al. |
| 2008/0157680 A1 | 7/2008 | Tominaga et al. |
| 2010/0053927 A1 * | 3/2010 | Inoue ....................... H01G 2/04 |
| | | 361/830 |

(Continued)

FOREIGN PATENT DOCUMENTS

| CN | 1391323 A | 1/2003 |
| CN | 101611463 A | 12/2009 |

(Continued)

OTHER PUBLICATIONS

Office Action dated Jul. 5, 2017, issued in counterpart Chinese Application No. 201510546486.3, with English translation. (10 pages).

*Primary Examiner* — Tuan T Dinh
*Assistant Examiner* — Rockshana Chowdhury
(74) *Attorney, Agent, or Firm* — Westerman, Hattori, Daniels & Adrian, LLP (57) ABSTRACT

A power conversion apparatus 2 has a configuration in which a plate-like bus-bar 80, 80' is disposed vertically so that a width direction thereof is set in a vertical direction, electrically connected to positive electric potential of a battery and fixed to a resin case 50 to include a flat plate-like bus-bar body 81, 82, to which positive electric potential of the battery is applied, and a voltage measuring terminal 82 to 85 branched from the bus-bar body 81, 82. The voltage measuring terminal 82 to 85 includes a projecting portion 83 projecting from the bus-bar body 81, 82, an upright portion (Continued)

84 extending from the projecting portion 83 upward toward a circuit board 100, and a measuring terminal portion 85 that is an upper part of the upright portion 84 and electrically connected to the circuit board 100.

3 Claims, 4 Drawing Sheets

(56) References Cited

U.S. PATENT DOCUMENTS

| | | | | |
|---|---|---|---|---|
| 2010/0327654 | A1* | 12/2010 | Azuma | B60L 11/04 307/9.1 |
| 2012/0231640 | A1* | 9/2012 | Ikeda | H01M 2/1061 439/110 |
| 2013/0021749 | A1* | 1/2013 | Nakajima | H02M 7/003 361/689 |

FOREIGN PATENT DOCUMENTS

| | | |
|---|---|---|
| CN | 202423437 U | 9/2012 |
| JP | 2012-210068 A | 10/2012 |
| JP | 5572577 B2 | 8/2014 |

* cited by examiner

FIG. 4B ered without. However, the connection terminals 18d, 18d of the connection. The connection of the connection terminals 18d, 18d of the connection. The connection of the connection terminals 18d, 18d of the connection.

POWER CONVERSION APPARATUS

BACKGROUND OF THE INVENTION

The present invention relates to a power conversion apparatus, and more particularly relates to a power conversion apparatus that can be preferably applied to a vehicle such as a hybrid car.

In recent years, in vehicles such as a four-wheeled vehicle, hybrid cars that use an engine being an internal combustion engine and an electric motor in cooperation for a drive system have been widely used.

In such hybrid cars, as one of an electronic control apparatus that operates an engine and an electric motor in a cooperated state, a power control apparatus that has a power conversion apparatus incorporated therein has been used. The power conversion apparatus is for inputting and outputting relatively large electric power. Therefore, a plurality of plate-like bus-bars made of a metal material are routed as electric wiring.

These bus-bars are routed in a case in which a plurality of semiconductor elements and the like that perform a switching operation at the time of power conversion are accommodated. Therefore, the bus-bars need to be routed in the case so as not to unnecessarily increase the size of the power conversion apparatus.

Further, such a power conversion apparatus handles relatively large power obtained by boosting a battery voltage or the like within the apparatus. Therefore, there are cases where it is necessary to measure voltage (potential) of an electric current path such as the bus-bar or the like in the power conversion apparatus.

Under such circumstances, Japanese Patent Application Laid-Open Publication No. 2012-210068 relates to an electronic control device of an electric motor, and discloses a configuration in which a second shunt resistor 18 that detects a drive current of the electric motor is provided in a bus-bar assembly 13 so that a resistor body 18a of the second shunt resistor 18 is made to abut on an upper surface of the bus-bar assembly 18, one side portion 18b of the second shunt resistor 18 is bonded to a conductive piece 27 through which the drive current of the motor passes, and one side portion 18c of the second shunt-resistor 18 is bonded to a heat transfer member 22. Further, connection terminals 18d, 18d respectively extended upward from the one side portions 18b and 18c are fixed to a control board 14 by soldering.

SUMMARY OF THE INVENTION

According to the studies by the present inventors, in the configuration of Japanese Patent Application Laid-Open Publication No. 2012-210063, while the second shunt resistor 18 is provided to detect the drive current, of the electric motor, because the second shunt resistor 18 is provided in the bus-bar assembly 13, at the time of soldering the connection terminals 18d, 18d to the control board 14 by soldering, heat dissipation is likely to occur from the connection terminals 18d, 18d to the bus-bar assembly 13, and there is a tendency that the temperature of the connection terminals 18a, 18d does not rise to an appropriate temperature. As a result, it can be considered that solderability of the connection terminals 18d, 18d with respect to the control board 14 may deteriorate.

According to further studies by the present inventors, in the configuration, of Japanese Patent Application Laid-Open Publication No. 2012-210068, at the time of performing soldering of the connection terminals 18d, 18d to the control board 14, a soldering fillet is formed on the opposite surfaces of the control board 14. Therefore, to ensure solderability and insulation properties, if is required to leave a space between the control board 14 and the bus-bar assembly 13. As a result, the casing size of the electronic control device may increase.

The present invention has been achieved in view of the above problems, and an object of the present invention is to provide a power conversion apparatus that can measure the voltage of a bus-bar without unnecessarily increasing the casing size, while improving solderability and ensuring insulation properties.

To achieve the above object, a first aspect of the present invention is to provide a power conversion apparatus comprising a semiconductor element; a cooler disposed below the semiconductor element to cool the semiconductor element; a resin case accommodating the semiconductor element; a circuit board electrically connected to the semiconductor element and mounted on an upper portion of the resin case; and a plate-like bus-bar electrically connected to positive electric potential of a battery and fixed to the resin case, such that the power conversion apparatus exhibits a power converting function by a switching operation of the semiconductor element. Here, the bus-bar is disposed vertically so that a width direction thereof is set in a vertical direction to include a flat plate-like bus-bar body, to which the positive electric potential of the battery is applied, and a voltage measuring terminal branched from the bus-bar body. Also, the voltage measuring terminal includes a projecting portion projecting from the bus-bar body, an upright portion extending from the projecting portion upward toward the circuit board, and a measuring terminal portion that is an upper part of the upright portion and electrically connected to the circuit board.

According to a second aspect of the present invention, in addition to the first aspect, a lower end of the projecting portion is set to be flush with a lower end of the bus-bar body.

According to a third aspect of the present invention, in addition to the first and second aspects, the entire part of the projecting portion and a part of the upright portion are molded in the resin case, and the resin case has a concave portion by depressing an upper end face of a peripheral wall thereof, and the upright portion extends out upward from the concave portion.

According to a fourth aspect of the present invention, in addition to the third aspect, the concave portion has a convex portion formed in a projecting manner in a bottom portion of the concave portion, in a portion where the upright portion is extended out.

According to the power conversion apparatus of the first aspect of the present invention, the plate-like bus-bar is disposed vertically so that the width direction thereof is set in a vertical direction, electrically connected to the positive electric potential of the battery and fixed to the resin case to include the flat plate-like bus-bar body, to which the positive electric potential of the battery is applied, and the voltage measuring terminal branched from the bus-bar body. The voltage measuring terminal includes the projecting portion projecting from the bus-bar body, the upright, portion extending from the projecting portion upward toward the circuit board, and the measuring terminal portion that is an upper part of the upright, portion and electrically connected to the circuit board. Accordingly, a power conversion apparatus that can measure the voltage of the bus-bar without unnecessarily increasing the casing size can be provided, while improving solderability and ensuring insulation properties. Particularly, because the projecting portion of the voltage measuring terminal can be extended out in a slender manner, the length of the voltage measuring terminal can be increased to increase thermal resistance of a voltage measuring path, thereby enabling to reduce heat dissipation from the voltage measuring terminal to the bus-bar. As a result, solderability at the time of flow soldering or the like can be improved.

According to the power conversion apparatus of the second aspect of the present invention, the lower end of the projecting portion is set to be flush with the lower end of the bus-bar body. Accordingly, the yield at the time of molding the bus-bar can be improved, and space saving and downsizing of the entire configuration can be realized.

According to the power conversion apparatus of the third aspect of the present invention, the entire part of the projecting portion and a part of the upright portion are molded in the resin case, and the resin case has the concave portion by depressing the upper end face of the peripheral wall thereof, and the upright portion extends out upward from the concave portion. Accordingly, a clearance space of a fillet formed at the time of soldering the measuring terminal portion can be ensured, while electrically insulating a portion including the measuring terminal portion of the bus-bar, with the number of components being reduced. As a result, a gap between the circuit board and the bus-bar can be narrowed, thereby enabling to reduce the size of the resin case.

According to the power conversion apparatus of the fourth aspect of the present invention, the concave portion has a convex portion formed in a projecting manner in the bottom portion of the concave portion, in a portion where the upright portion is extended out. Accordingly, anchorage strength and position accuracy of the voltage measuring terminal can be improved.

DETAILED DESCRIPTION OF THE PREFERRED EMBODIMENT

Embodiments of a power conversion apparatus according to the present invention are explained in detail below with reference to the accompanying drawings. In the drawings, an x-axis, a y-axis, and a z-axis form a triaxial rectangular coordinate system, and a direction of the z-axis corresponds to a vertical direction.

[Configuration of Power Control Apparatus]

A configuration of a power control apparatus to which the power conversion apparatus according to the present embodiment is applied is described in detail with reference to FIG. 1.

Figure 1:
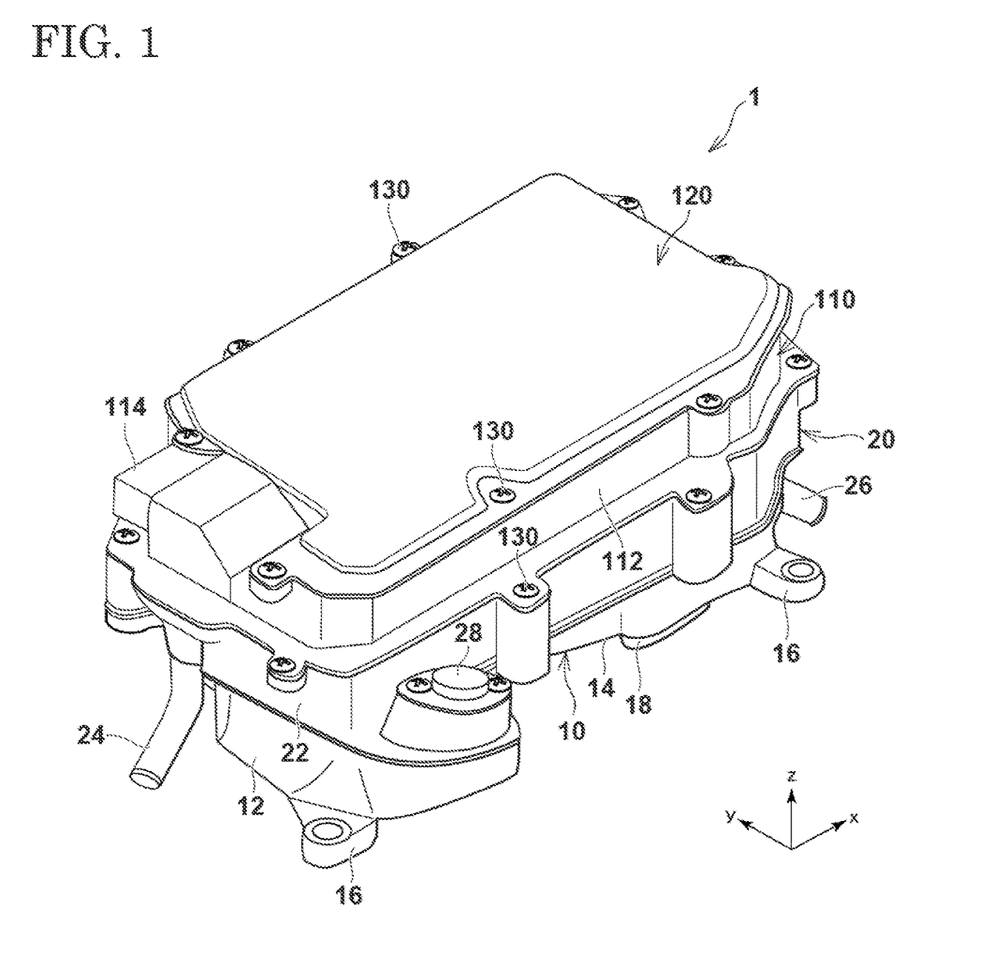
FIG. 1 is a perspective view showing a configuration of a power control apparatus to which a power conversion apparatus according to an embodiment of the present invention is applied.

FIG. 1 is a perspective view showing a configuration of the power control apparatus to which the power conversion apparatus of the present embodiment is applied.

As shown in FIG. 1, a power control, apparatus 1 includes a lower case 10 arranged at a lowermost part thereof, a middle case 20 fixed on the lower case 10, an upper case 110 fixed on the middle case 20, and a cover 120 fixed on the upper case 110 to close an uppermost part, of the power control apparatus 1. The power control apparatus 1 is mounted on a vehicle such as a hybrid car (not shown). The lower case 10, the middle case 20, the upper case 110, and the cover 120 are typically castings made of metal such as an aluminum material or a formed article by means of press work, and are fastened by a fastener member 130 such as a bolt to form an assembly. The power control apparatus 1 typically controls power supplied from a battery (not shown) being a secondary battery to an electric drive motor, and power supplied from a regeneration mechanism (not shown) to the battery, both of the battery and the regeneration mechanism being mounted on the vehicle. The power control apparatus 1 can control only either of the power supplied in this manner, as required.

Specifically, the lower case 10 includes a lower peripheral wall 12 that surroundingly extends around a vertical axis on a plane parallel to an x-y plane, a bottom wall 14 to close the bottom portion of the lower case 10, and fixing parts 16 being a mounting part to a vehicle, which are arranged at four corners of the lower peripheral wall 12. In the lower case 10, a smoothing capacitor (not shown) and the like are accommodated and mounted, and a three-phase current connector extending downward from the lower case 10 with a lower end portion exposed outward is mounted via the bottom wall 14. In FIG. 1, only a three-phase current connector 18 on an input side is shown.

The middle case 20 includes a middle peripheral wall 22 that surroundingly extends around the vertical axis on the plane parallel to the x-y plane, a coolant feed pipe 24 fixed to the middle peripheral wall 22 to supply a coolant to the middle case 20, a coolant exhaust pipe 26 fixed to the middle peripheral wall 22 to discharge the coolant supplied to the middle case 20, and a DC current connector 28 fixed to a flared portion continuous to the middle peripheral wall 22. In the middle case 20, a step up/down reactor (not shown) is accommodated and mounted, and a power conversion apparatus 2 described later in detail is accommodated and mounted. The step up/down reactor functions as a step-up reactor when power is supplied from the battery to the electric drive motor, and functions as a step-down reactor when power is supplied from the regeneration mechanism to the battery.

The upper case 110 includes an upper peripheral wall 112 that surroundingly extends around the vertical axis on the plane parallel to the x-y plane, and an input/output signal connector 114 attached to the upper peripheral wall 112. In the upper case 110, an ECU (Electronic Control Unit) (not shown) for power control is accommodated and mounted.

The cover 120 is a plate-like member with an outer peripheral edge portion thereof fixed to the upper peripheral wall 112 of the upper case 110. The lower peripheral wall 12 of the lower case 10, the middle peripheral wall 22 of the middle case 20, the upper peripheral wall 112 of the upper case 110, the bottom wall 14 of the lower case 10, and the cover 120 define an accommodating space therein.

[Configuration of Power Conversion Apparatus]

A configuration of the power conversion apparatus according to the present embodiment is described in detail with reference to FIG. 2A to FIG. 3A as well.

Figure 2A:
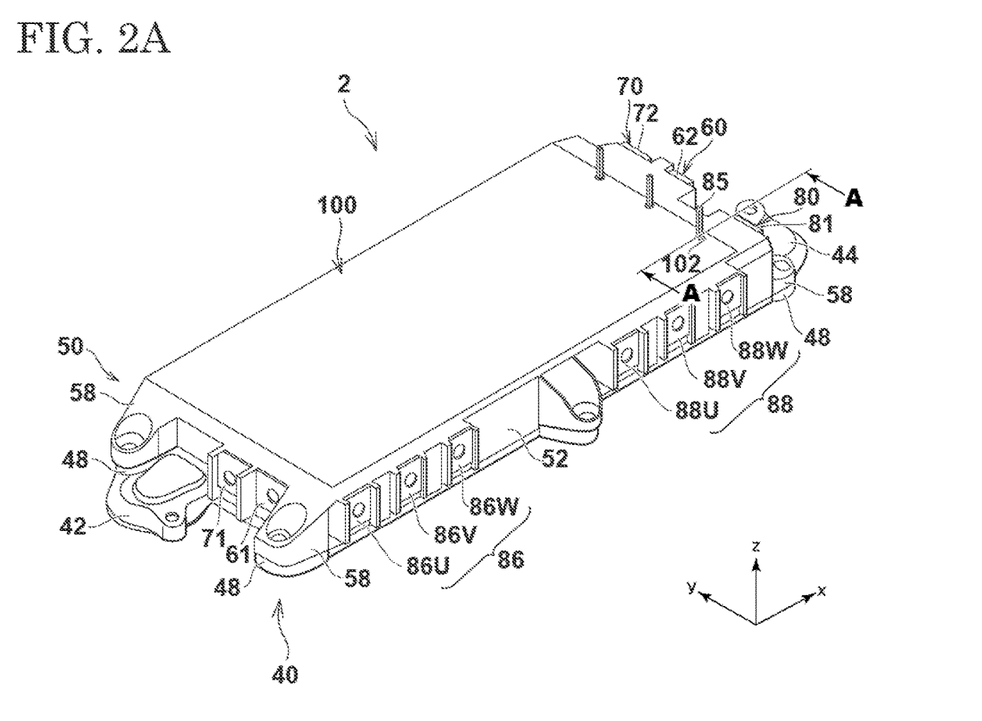
FIG. 2A is a perspective view showing a configuration of the power conversion apparatus according to the present embodiment.
Figure 2B:
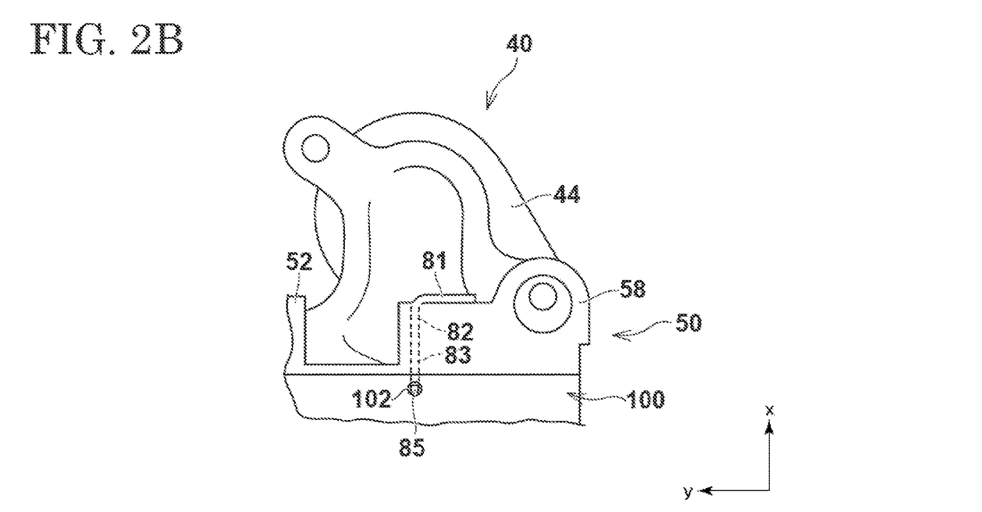
FIG. 2B is a partially enlarged plan view of the power conversion apparatus according to the present, embodiment.
Figure 3A:
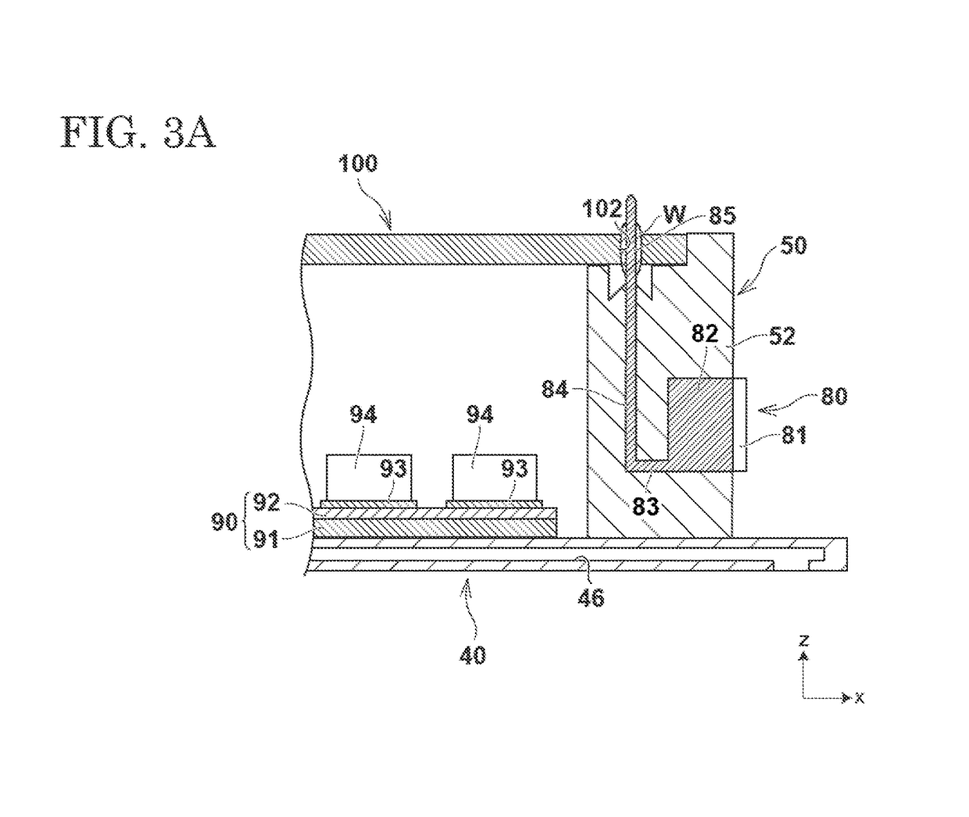
FIG. 3A is a partially enlarged sectional view along a line A-A in FIG. 2A.

FIG. 2A is a perspective view showing a configuration of the power conversion apparatus according to the present embodiment. FIG. 2B is a partially enlarged plan view of the power conversion apparatus according to the present embodiment. FIG. 3A is a partially enlarged sectional view along a line A-A in FIG. 2A.

As shown in FIGS. 2A to 3A, a power conversion apparatus 2 includes a cooler 40, which is a water-cooling type fixed to the middle case 20 to cool constituent elements therein, a case 50 fixed on the cooler 40, a lower circuit board 90 accommodated in the case 50 and mounted on the cooler 40, a plurality of semiconductor elements 94 electrically connected to the lower circuit board 90 and mounted thereon via a solder layer 93, and an upper circuit board 100 electrically connected to the semiconductor elements 94 and mounted on an upper portion of the case 50 above the semiconductor elements 94. The power conversion apparatus 2 also includes a laminated bus-bar B mounted on the lower circuit board 90 while being electrically connected to the lower circuit board 90, the semiconductor elements 94, and the upper circuit board 100, with opposite ends on positive and negative sides of the x-axis extending outside of the case 50 and fixed thereto while extending in a space between the semiconductor elements 94 in the case 50, and formed of a first bus-bar 60, a second bus-bar 70, and an insulating material (not shown) arranged therebetween. Further, the power conversion apparatus 2 includes a third bus-bar 80 with an end portion thereof extending outward of the case 50 on the positive side of the x-axis and fixed to the case 50, while extending in the case 50, an output-side three-phase terminal 86 fixed to the case 50, and an input-side three-phase terminal 88 fixed to the case 50. As a result, the cooler 40, the lower circuit board 90, the solder layer 93, the semiconductor elements 94, and the upper circuit board 100 are sequentially stacked in a vertical direction, and the lower circuit board 90, the solder layer 93, and the semiconductor elements 94 are accommodated in the case 50. The power conversion apparatus 2 typically has both a DC (Direct Current)/AC (Alternate Current) conversion function for converting DC power from the battery to three-phase current power to supply the three-phase current power to the electric drive motor, and an AC/DC conversion function for converting three-phase current power from the regeneration mechanism to DC power to supply the DC power to the battery. The power conversion apparatus 2 can have one of the DC/AC conversion function and the AC/DC conversion function as required.

The cooler 40 is typically a casting molded article made of metal such as an aluminum material, and includes a coolant introducing pipe 42 communicating with the coolant feed pipe 24, a coolant deriving pipe 44 communicating with the coolant exhaust pipe 26, a coolant flow path 46 communicating between the coolant introducing pipe 42 and the coolant, deriving pipe 44, and four support portions 48 fixed to the middle case 20, The cooler 40 cools the semiconductor elements 94 via the lower circuit board 90 and the solder layer 93 by a coolant flowing in the coolant flow path 46.

The case 50 is typically a molded article made of non-conductive resin (synthetic resin), and includes a vertical peripheral wall 52 that surroundingly extends around the vertical axis on the plane parallel to the x-y plane, concave portions 54 formed by depressing a part of an upper surface of the vertical peripheral wall 52, convex portions 56 formed in a projecting manner in a bottom portion of the concave portions 54, and a mounting portion 58 formed respectively at four corners outside of the vertical peripheral wall 52 and mounted on the support portion 48 of the cooler 40 correspondingly by fastening or the like. The vertical peripheral wall 52 is a rectangular frame body with a direction parallel to the x-axis being a longitudinal direction and a direction parallel to the y-axis being a width direction, as viewed in a plan view.

The output-side three-phase terminal 86 includes an output-side U-phase terminal 86U, an output-side V-phase terminal 86V, and an output-side W-phase terminal 86W, which are sequentially arranged adjacent to each other in the positive direction of the x-axis and fixed to an outside wall portion of the vertical peripheral wall 52 of the case 50 on the negative direction side of the y-axis. These terminals are electrically connected with the corresponding terminals of the semiconductor elements 94, and are also electrically connected with an output-side three-phase current connector mounted on the lower case 10.

The input-side three-phase terminal 88 includes an input-side U-phase terminal 88U, an input-side V-phase terminal 88V, and an input-side W-phase terminal 88W, which are sequentially arranged adjacent to each other on the positive direction side of the x-axis of the output-side three-phase terminal 86, and fixed to the outside wall portion of the vertical peripheral wall 52 of the case 50 on the negative direction side of the y-axis. These terminals are electrically connected with the corresponding terminals of the semiconductor elements 94, and are also electrically connected with an input-side three-phase current connector 18 mounted on the lower case 10.

The lower circuit board 90 is arranged parallel to the x-y plane and is typically a plate-like DCB (Direct Copper Bond) board, and is a circuit board obtained by bonding a copper circuit board 92 on an insulation board 91 being an alumina ceramic board. A lower surface of the insulation board 91 is mounted on an upper surface of the cooler 40, in which the coolant flow path 46 is formed, via a solder-layer (not shown). The solder layer 93 is bonded at a predetermined portion on an upper surface of the copper circuit board 92.

The semiconductor elements 94 are typically power semiconductor elements such as an IGBT (Insulated Gate Bipolar Transistor), and bonded on the copper circuit board 92 of the lower circuit board 90 via the solder layer 93, and the terminals thereof are electrically connected to the copper circuit board 92 of the lower circuit board 90 correspondingly. The semiconductor elements 94, the smoothing capacitor in the lower case 10, and the step up/down reactor in the middle case 20 are constituent elements of a power conversion circuit.

The upper circuit board 100 is arranged parallel to the x-y plane and is typically a circuit board such as a plate-like PCB (Printed Circuit Board), and has through holes 102. Semiconductor elements and the like constituting a drive circuit (not shown) that drives the semiconductor elements 94 are mounted on the upper circuit board 100. A drive circuit of the upper circuit board 100 is electrically connected to a corresponding terminal of the semiconductor elements 94. Under drive control by the drive circuit, the semiconductor elements 94 cooperate with each other to perform a switching operation, thereby realizing a power converting function of the power conversion apparatus 2.

[Configuration of Bus-Bar]

Configurations of various types of bus-bars of the power conversion apparatus according to the present embodiment are described next in detail, with reference to FIGS. 3B to 4B as well.

Figure 3B:
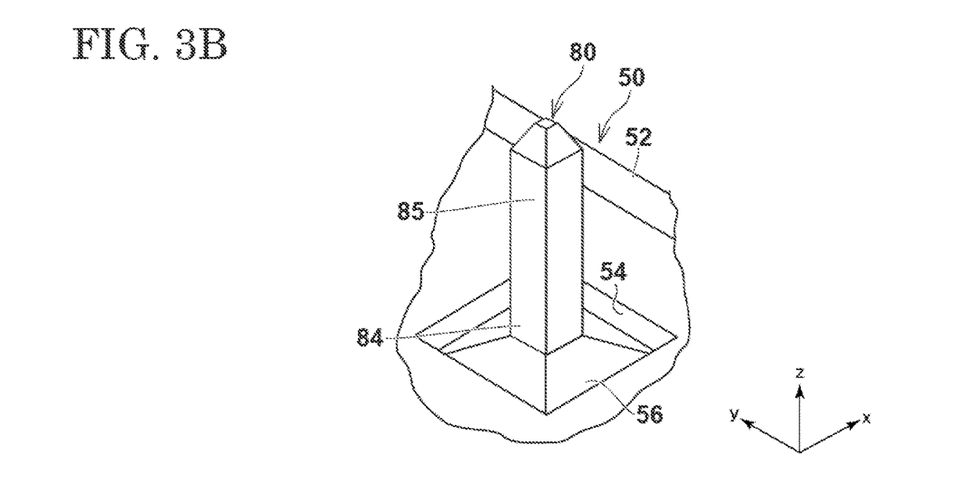
FIG. 3B is a partially enlarged perspective view of the power conversion apparatus according to the present embodiment.
Figure 4A:
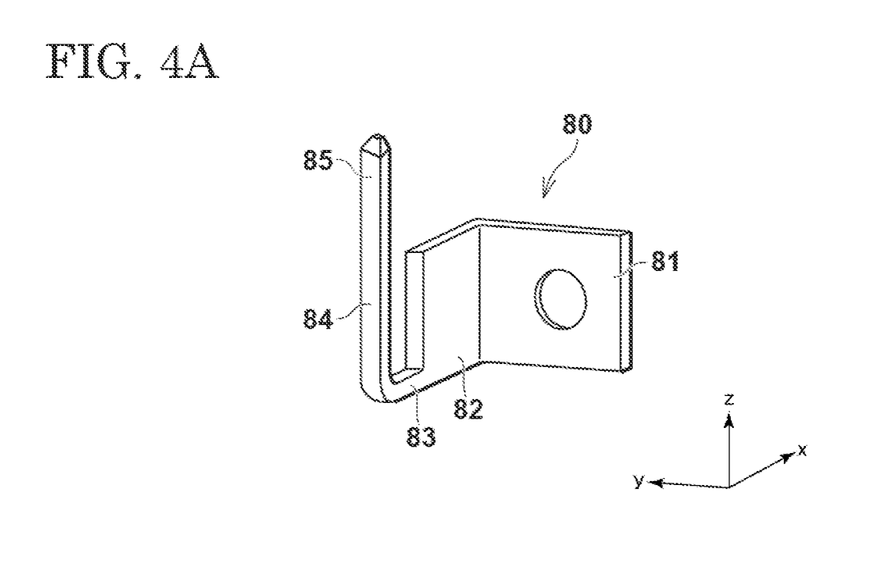
FIG. 4A is a partially enlarged perspective view showing a configuration of a third bus-bar of the power conversion apparatus according to the present embodiment.
Figure 4B:
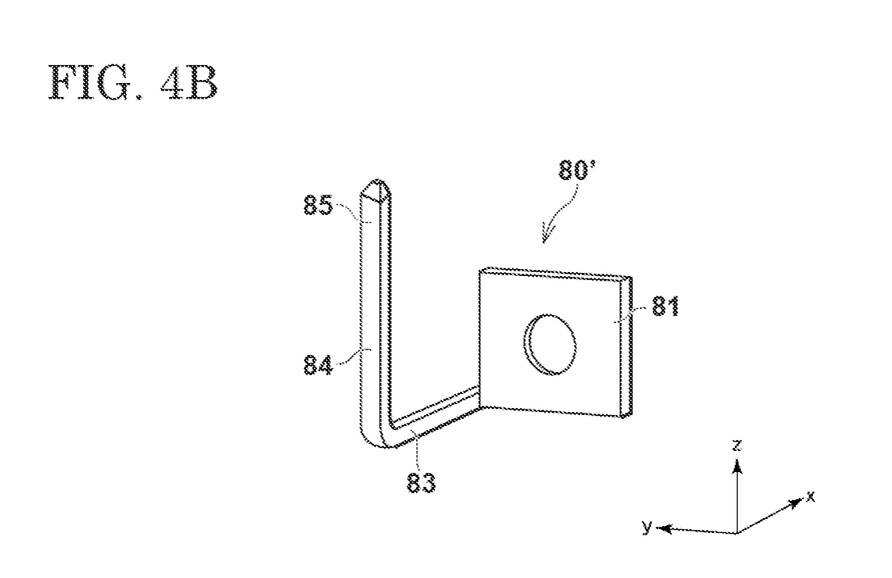
FIG. 4B is a partially enlarged perspective view showing a configuration of a modification of the third bus-bar of the power conversion apparatus according to the present embodiment.

FIG. 3B is a partially enlarged perspective view of the power conversion apparatus according to the present embodiment. FIG. 4A is a partially enlarged perspective view showing the configuration of the third bus-bar of the power conversion apparatus according to the present embodiment. FIG. 4B is a partially enlarged perspective view showing a configuration of a modification of the third bus-bar of the power conversion, apparatus according to the present embodiment. In FIG. 3B, illustrations of the upper circuit board are omitted.

As shown in FIGS. 2A to 3A explained above, the laminated bus-bar B is a laminated structure formed of the first, bus-bar 60, the second bus-bar 70, and an insulating material (not shown) arranged therebetween. The laminated bus-bar B extends in a longitudinal direction in the case 50 so as to pass through a gap between the semiconductor elements 94 above the lower circuit board 90, and passes completely through the vertical peripheral wall 52 of the case 50 on the positive and negative directions sides of the x-axis to extend to the outside thereof. The first bus-bar 60 is electrically connected to negative potential (electric potential) of the battery, while the second bus-bar 70 is electrically connected to positive potential (electric potential) of the battery via the step up/down reactor in the middle case 20, and the directions of electric current flowing in the first bus-bar 60 and electric current flowing in the second bus-bar 70 are opposite to each other.

The first bus-bar 60 is formed of a conductive plate-like member, typically, one plate-like member made of metal arranged vertically so that the width direction thereof becomes a vertical direction. The first bus-bar 60 includes a first negative-potential connecting terminal portion 61 fixed to the outside wall portion of the vertical peripheral wall 52 of the case 50 on a negative direction side of the x-axis, a second negative-potential connecting terminal portion 62 fixed to the outside wall portion of the vertical peripheral wall 52 of the case 50 on the positive direction side of the x-axis, and an extending portion (not shown) extending in the case 50. The first negative-potential connecting terminal portion 61 is electrically connected to the DC current connector 28 mounted on the middle case 20 via the smoothing capacitor in the lower case 10. The potential of the second negative-potential connecting terminal portion 62 is the most downstream side potential of the semiconductor elements 94 with respect to the battery. The extending portion is electrically connected to the corresponding terminal of the semiconductor elements 94.

The second bus-bar 70 is formed of a conductive plate-like member, typically, one plate-like member made of metal arranged vertically so that the width direction thereof becomes a vertical direction, as in the first bus-bar 60. The second bus-bar 70 includes a first positive-potential connecting terminal portion 71 fixed to the outside wall portion of the vertical peripheral wall 52 of the case 50 on the negative direction side of the x-axis, a second positive-potential connecting terminal portion 72 fixed to the outside wall portion of the vertical peripheral wall 52 of the case 50 on the positive direction side of the x-axis, and an extending portion (not shown) extending in the case 50. The first positive-potential connecting terminal portion 71 is electrically connected to the DC current connector 28 mounted on the middle case 20 via the smoothing capacitor in the lower case 10 and the step up/down reactor in the middle case 20. The potential of the second positive-potential connecting terminal portion 72 is the most downstream side potential of the semiconductor elements 94 with respect to the battery. The extending portion is electrically connected to the corresponding terminal of the semiconductor elements 94.

Meanwhile, as shown in FIG. 3B and FIG. 4A, the third bus-bar 80 is formed of a conductive plate-like member, typically, one plate-like member made of metal arranged vertically so that the width direction thereof becomes a vertical direction, as in the first bus-bar 60 and the second bus-bar 70. The third bus-bar 80 is mainly arranged in a region on the positive direction side of the x-axis of the case 50, and a portion extending in the case 50 is short.

Specifically, the third bus-bar 80 is arranged parallel to the first bus-bar 60 and the second bus-bar 70 on the negative direction side of the y-axis, at a height, position equal to vertical positions of the first bus-bar 60 and the second bus-bar 70. The third bus-bar 80 includes a flat plate-like third positive-potential connecting terminal portion 81 fixed to the outside wall portion of the vertical peripheral wall 52 of the case 50 on the positive direction side of the x-axis, a flat plate-like extending portion 82 continuous to an end of the third positive-potential connecting terminal portion 81 on a positive direction side of the y-axis and then extending inward of the vertical peripheral wall 52, and a projecting portion 83 that is continuous to a lower end of the extending portion 82 on the negative direction side of the x-axis and then branched to a negative direction of the x-axis and projects therefrom. The third bus-bar 80 further includes an upright portion 84 that is continuous to an end of the projecting portion 83 on the negative direction side of the x-axis, and then is bent upward to extend while projecting in the upward direction, and a measuring terminal portion 85 that is an upper constituent portion of the upright portion 84 and is electrically connected to the upper circuit board 100. The positive potential of the battery, which is applied to the positive terminal of the smoothing capacitor, is electrically connected to the third positive-potential connecting terminal portion 81, and the respective potentials of the third positive-potential connecting terminal portion 81, the extending portion 82, the projecting portion 83, the upright portion 84, and the measuring terminal portion 85 are the positive potential of the battery applied to the positive terminal of the smoothing capacitor in the lower case 10. The extending portion 32 is typically a portion having a plate width equal to that of the third positive-potential connecting terminal portion 81 and continuous thereto, and the third positive-potential connecting terminal portion 81 and the extending portion 82 correspond to the bus-bar body of the third bus-bar 80.

The projecting portion 83, the upright portion 84, and the measuring terminal portion 85 respectively have a length in a plate-width direction that is shorter than that of the extending portion 82, and substantially constitute a bar-like positive-potential-side measuring terminal. The projecting portion 83 has a configuration such that the projecting portion 83 is continuous to the lower end of the extending portion 82 on the negative direction side of the x-axis and then projects in the negative direction of the x-axis, thereby contributing to an increase of thermal resistance between the ends of the positive-potential-side measuring terminal by setting the whole length thereof to be long. This contributes to improve solderability by reducing heat dissipation at the time of soldering the measuring terminal portion 85 to the upper circuit board 100 by flow solder or the like. A projecting direction of the projecting portion 83 can be parallel to the negative direction of the x-axis or intersecting with the negative direction of the x-axis. However, a height position of the lower end of the projecting portion 83 is desirably set so as to be equal to a height position of the lower end of the extending portion 82, with the lower end of the projecting portion 83 being flush with the lower end of the extending portion 82, from a viewpoint that does not deteriorate the yield of the third bus-bar 30 and does not unnecessarily lower the height position of the lower end of the third bus-bar 80 and the height position of the lower end of the vertical peripheral wall 52 of the case 50. The projecting portion 83 and the upright portion 84 are mainly in a linear shape; however, can be formed in a curved shape or the like so as to set the whole length of the positive-potential-side measuring terminal to be longer.

In the third bus-bar 80, it is preferable that the entire part of the extending portion 82 and the projecting portion 83 is integrally molded with the vertical peripheral wall 52 of the case 50, from a viewpoint of reliably fixing the third bus-bar 80 to the case 50, while reducing the number of components of the entire apparatus, in a mode with electrical insulation properties thereof being ensured.

In the third bus-bar 80, a lower part of the upright portion 84 is integrally molded with the vertical peripheral wall 52 of the case 50. An upper part thereof and the measuring terminal portion 85 are exposed on the upper side of the vertical peripheral wall 52 of the case 50. At the same time, at an upper end of the vertical peripheral wall 52, the concave portion 54 is provided by depressing the upper surface thereof, and the upper part of the upright portion 84 preferably extends upward from the concave portion 54 and exposed. This is for setting a clearance space of a solder W, particularly, of the fillet by the concave portion 54 on the lower surface side of the upper circuit board 100, at the time of soldering the measuring terminal portion 85 to the upper circuit board 100 via a through-hole 102 by the solder W. The soldering is typically flow soldering. Further, it is preferable that the convex portion 56 formed in the projecting manner on the upper surface of the concave portion 54 is provided at the bottom thereof. This is for reinforcing and supporting the exposed lower end of the upright portion 84 extending from the vertical peripheral wall 52 to the outside by the convex portions 56.

Regarding the third bus-bar 80, various modifications can be made.

For example, as shown in FIG. 4B, regarding the third bus-bar 80, the configuration thereof is further simplified according to need, to configure such that the extending portion 82 is excluded like a third bus-bar 80' in a modification, and the projecting portion 83 is continuous to the lower end of the third positive-potential connecting terminal portion 81 on the positive direction side of the y-axis and then projects therefrom in the negative direction of the x-axis. In this case, only the third positive-potential connecting terminal portion 81 corresponds to the bus-bar body in the third bus-bar 80, and the projecting portion 83 is continuous to the lower-end of the third positive-potential connecting terminal portion 81 on the positive direction side of the y-axis and then branched therefrom and bent in the negative direction of the x-axis to project therefrom.

In the present modification, the projecting portion 83 is continuous to the lower end of the third positive-potential connecting terminal portion 81 on the positive direction side of the y-axis and then branched therefrom and bent in the negative direction of the x-axis to project therefrom, thereby contributing to an increase of thermal resistance between the ends of the positive-potential-side measuring terminal by setting the whole length thereof to be long. This contributes to improve solderability by reducing heat dissipation at the time of soldering the measuring terminal portion 85 to the upper circuit board 100 by flow solder or the like. Also in this case, the projecting direction of the projecting portion 83 can be parallel to the negative direction of the x-axis or intersecting with the negative direction of the x-axis. However, the height position of the lower end of the projecting portion 83 is desirably set so as to be equal to the height position of the lower end of the third positive-potential connecting terminal portion 81, with the lower end of the projecting portion 83 being flush with the lower end of the third positive-potential connecting terminal portion 81, from a viewpoint that does not deteriorate the yield of the third bus-bar 80 and does not unnecessarily lower the height position of the lower end of the third bus-bar 80 and the height position of the lower end of the vertical peripheral wall 52 of the case 50. Also in this case, the projecting portion 83 and the upright portion 84 are mainly in the linear shape; however, can be formed in a curved shape or the like so as to set the whole length of the positive-potential-side measuring terminal to be longer.

As is apparent from the above explanations, in the power conversion apparatus 2 according to the present embodiment, the plate-like bus-bar 80, 80' is disposed vertically so that the width direction thereof is set in a vertical direction, electrically connected to the positive electric potential of the battery and fixed to the resin case 50 to include the flat plate-like bus-bar body 81, 82, to which the positive electric potential of the battery is applied, and the voltage measuring terminal 82 to 85 branched from the bus-bar body 81, 82. The voltage measuring terminal 82 to 85 includes the projecting portion 83 projecting from the bus-bar body 81, 82, the upright, portion 84 extending from the projecting portion 83 upward toward the circuit, board 100, and the measuring terminal portion 85 that is the upper part, of the upright portion 84 and electrically connected to the circuit board 100. Accordingly, the power conversion apparatus 2 that can measure the voltage of the bus-bar 80, 80' without unnecessarily increasing the casing size can be provided, while improving solderability and ensuring insulation properties. Particularly, because the projecting portion 83 of the voltage measuring terminal 82 to 85 can be extended out in a slender manner, the length of the voltage measuring terminal can be increased to increase the thermal resistance of the voltage measuring path, thereby enabling to reduce heat dissipation from the voltage measuring terminal to the bus-bar 80, 80'. As a result, solderability at the time of flow soldering or the like can be improved.

Furthermore, in the power conversion apparatus 2 according to the present embodiment, the lower end of the projecting portion 83 is set to be flush with the lower end of the bus-bar body 81, 82. Accordingly, the yield at the time of molding the bus-bar 80, 80' can be improved, and space saving and downsizing of the entire configuration can be realized.

Further, in the power conversion apparatus 2 according to the present embodiment, the entire part of the projecting portion 83 and a part of the upright portion 84 are molded in the resin case 50, and the resin case 50 has the concave portion 54 by depressing the upper end face of the peripheral wall thereof, and the upright portion 84 extends out upward from the concave portion 54. Accordingly, a clearance space of a fillet formed at the time of soldering the measuring terminal portion 85 can be ensured, while electrically insulating a portion including the measuring terminal portion 85 of the bus-bar 80, 80', with the number of components being reduced. As a result, a gap between the circuit board 100 and the bus-bar 80, 80' can be narrowed, thereby enabling to reduce the size of the resin case 50.

Further, in the power conversion apparatus 2 according to the present embodiment, the concave portion 54 has the convex portion 56 formed in the projecting manner in the bottom portion of the concave portion 54 in the portion where the upright portion 84 is extended out. Accordingly, anchorage strength and position accuracy of the voltage measuring terminal 82 to 85 can be improved.

In the present invention, the type, the form, the arrangement, the number, and the like of the constituent members are not limited to those in the embodiment explained above, and it is needless to mention that the constituent elements can be modified as appropriate without departing from the scope of the invention, such as appropriately replacing these elements by other ones having identical operational effects.

As described above, the present invention can provide the power conversion apparatus that, can measure the voltage of a bus-bar, without unnecessarily increasing the casing size, while improving solderability and ensuring insulation properties. Therefore, because of its general purposes and universal characteristics, applications of the present invention can be expected in a wide range in the field of a power control apparatus for vehicles such as a hybrid car.

Reference is hereby made to a Patent Application No. TOKUGAN 2014-185134 with a filing date of Sep. 11, 2014 in Japan, the entire content of which is incorporated herein by reference.

What is claimed is:

1. A power conversion apparatus comprising:
   a semiconductor element;
   a cooler disposed below the semiconductor element to cool the semiconductor element;
   a resin case accommodating the semiconductor element;
   a circuit board electrically connected to the semiconductor element and mounted on an upper portion of the resin case; and
   a plate-like bus-bar electrically connected to positive electric potential of a battery and fixed to the resin case, the power conversion apparatus exhibiting a power converting function by a switching operation of the semiconductor element,
   wherein the bus-bar includes a flat plate-like bus-bar body, which is fixed to an outside wall portion of the resin case with being disposed vertically so that a width direction thereof is set in a vertical direction and to which the positive electric potential of the battery is applied, and a voltage measuring terminal branched from the bus-bar body,
   wherein the voltage measuring terminal includes a projecting portion projecting from the bus-bar body, an upright portion extending from the projecting portion upward toward the circuit board, and a measuring terminal portion that is an upper part of the upright portion and electrically connected to the circuit board,
   wherein the resin case has a concave portion by depressing an upper end face of a peripheral wall thereof, and the upright portion extends out upward from the concave portion, and
   wherein the concave portion has a convex portion formed in a projecting manner in a bottom portion of the concave portion, in a portion where the upright portion is extended out from the circuit board.

2. The power conversion apparatus according to claim 1, wherein a lower end of the projecting portion is set to be flush with a lower end of the bus-bar body.

3. The power conversion apparatus according to claim 1, wherein an entire part of the projecting portion and a part of the upright portion are molded in the resin case.

* * * * *